United States Patent
Na et al.

(10) Patent No.: US 7,474,193 B2
(45) Date of Patent: Jan. 6, 2009

(54) TOROIDAL LINE FILTER AND METHOD OF WINDING COIL OF TOROIDAL LINE FILTER

(75) Inventors: Tae-Kwon Na, Cheongju-si (KR); Chul-woo Oh, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/219,863

(22) Filed: Sep. 7, 2005

(65) Prior Publication Data
US 2006/0055496 A1   Mar. 16, 2006

(30) Foreign Application Priority Data
Sep. 11, 2004   (KR) ...................... 10-2004-0072837

(51) Int. Cl.
*H01F 27/28* (2006.01)
(52) U.S. Cl. ...................................... 336/229
(58) Field of Classification Search .................. 336/65, 336/83, 170, 180–185, 192, 200, 220–222, 336/229; 333/177, 181
See application file for complete search history.

(56) References Cited

U.S. PATENT DOCUMENTS

| | | | | | |
|---|---|---|---|---|---|
| 3,365,721 | A | * | 1/1968 | Bittner | ........................ 343/856 |
| 3,387,203 | A | * | 6/1968 | Munnelly | ..................... 363/171 |
| 3,944,937 | A | * | 3/1976 | Fujisawa et al. | ............. 333/178 |
| 4,031,540 | A | * | 6/1977 | Borys, Jr. | ..................... 343/860 |
| 6,031,442 | A | * | 2/2000 | Nakazawa | ..................... 336/96 |
| 2002/0017916 | A1 | * | 2/2002 | Costello et al. | ............. 324/760 |
| 2002/0080001 | A1 | * | 6/2002 | Kobayashi et al. | .......... 336/229 |

FOREIGN PATENT DOCUMENTS

| | | | |
|---|---|---|---|
| JP | 61-140049 | * | 6/1986 |
| JP | 63-318114 | * | 12/1988 |
| JP | 02-060117 | * | 2/1990 |
| JP | 02-087609 | * | 3/1990 |
| JP | 05-41326 | | 2/1993 |
| JP | 06-151222 | | 5/1994 |
| JP | 08-213260 | | 8/1996 |
| JP | 11087148 A | * | 3/1999 |
| JP | 2000-000279 | | 1/2000 |
| KR | 2002-0033600 | | 5/2002 |

* cited by examiner

*Primary Examiner*—Tuyen T. Nguyen
(74) *Attorney, Agent, or Firm*—Roylance, Abrams, Berdo & Goodman, LLP

(57) ABSTRACT

Disclosed is a toroidal line filter with coils wound through various winding processes such that an inductance characteristic for a certain frequency can be improved through changes in current flowing direction and/or area, whereby the toroidal line filter can compensate for a poor EMI characteristic at the certain frequency without adding extra components such as an inductor or a capacitor. The toroidal line filter comprises an annular core and coils wound around the annular core. The coils are wound in such a way that first winding is wound over a predetermined partial area of the annular core, which is not the entire area of the annular core, and then second winding is wound over the remaining area of the annular core.

2 Claims, 4 Drawing Sheets

TOROIDAL LINE FILTER AND METHOD OF WINDING COIL OF TOROIDAL LINE FILTER

CROSS-REFERENCE TO RELATED APPLICATION

This application claims the benefit under 35 U.S.C. § 119 (a) of Korean Patent Application No. 2004-72837, filed Sep. 11, 2004, in the Korean Intellectual Property Office, the entire disclosure of which is hereby incorporated by reference.

BACKGROUND OF THE INVENTION

1. Field of the Invention

The present invention relates to a method of winding a toroidal line filter employed in a primary AC power source terminal of a switching mode power supply (SMPS) for use in supplying power to a printer or other electric or electronic appliance so as to improve an electromagnetic interference (EMI) characteristic.

2. Description of the Related Art

An SMPS is a module type power supply for transforming externally supplied electricity to be suitable for various electric or electronic appliances including computers, TV's, VCR's, wireless communication appliances, or the like. This serves to intermittently control a high frequency which is higher than a commercial frequency by using a switching feature of a semiconductor and to prevent damage. Such SMPS's are becoming more commonly used as a main power supply for electric or electronic appliances because they are advantageous due to their small size and superior efficiency.

Although such SMPS's are advantageous due to their small size and light weight, they have a problem of producing noise and EMI caused by a switching transistor or the like.

A toroidal line filter is employed in a primary AC power supply terminal so as to improve noise and EMI characteristics produced in an SMPS, a typical example of which is shown in FIGS. 1A and 1B.

As shown in FIGS. 1A and 1B, a toroidal line filter comprises a base plate 10, an annular core 20 supported on the base plate 10 and coils 30 wound around the annular core 20.

The coils 30 are wound around the core 20 in such a way that a first coil is wound over several turns upwardly from the lowermost end 20a to the uppermost end 20b of the core 20 (see solid line arrow in FIG. 1B), a second coil is wound downwardly from the uppermost end 20b to the lowermost end 20a of the core 20 (see one-dot-chain line arrow in FIG. 1B), and a third coil is wound upwardly again from the lowermost end 20a to the uppermost end 20b of the core 20 (see two-dot-chain line arrow in FIG. 1B).

In this way, the coils 30 are wound upwardly and downwardly over the entire area of the core 20 three or more times. A toroidal line filter configured in this manner is mounted on a substrate (not shown) by means of plural contacts 11 and 12 projecting downward from the base plate 10.

Such a line filter basically exhibits an inductor function as an L device. That is, because the line filter has a fixed inductance L value, it removes a noise frequency produced from each noise source by counterbalancing the noise frequency with an inductance frequency component of the line filter. Such a capability of the line filter is determined by the permeability of the core 20 and the number of windings of the coils 30. In an ordinary line filter, coil 30 is wound several times upwardly and downwardly over the entire area of the core 20 and thus the current flowing direction is fixed over the entire area of the core 20.

With the design of existing line filters, the number of cores 20 is usually limited to one, two or three because of mass production considerations and the number of windings 30 of the coils 20 is limited because it is necessary for the coils 20 to retain a predetermined thickness due to thermal constraints. If a problem is caused in a certain frequency range from the viewpoint of EMI and thus it is required to provide an improvement for the corresponding frequency band, there is no other way than to add an inductor and a capacitor in order to obtain the desired change in the frequency characteristic with the existing line filters. However, the addition of such components is contrary to the weight-reduction and miniaturization of a product and includes ancillary problems such as increased cost and energy loss.

SUMMARY OF THE INVENTION

Accordingly, the present invention has been made to solve at least the above-mentioned problems and to provide other benefits, and an object of the present invention is to provide a toroidal line filter with coils being wound through various winding processes such that an inductance characteristic for a certain frequency can be improved through a change in current flowing direction and/or area, whereby the toroidal line filter can cope with a poor EMI characteristic at the certain frequency without having to modify circuitry by adding any components such as inductors or capacitors.

In order to achieve the above-mentioned objects, there is provided a toroidal line filter comprising an annular core and coils wound around the annular core, wherein the coils are configured in such a way that the coils are firstly wound not over the entire area but over a predetermined partial area of the annular core and then secondarily wound over the remaining area of the annular core.

According to an embodiment of the present invention, a first coil is wound upwardly from the lowermost end to substantially the central part of the annular core, a second coil is wound downwardly from the central part to the lowermost end of the annular core, a third coil is wound upwardly from the lowermost end to the uppermost end of the annular core, a fourth coil is wound downwardly from the uppermost end to the central part of the annular core, and a fifth coil is wound upwardly from the central part to the uppermost end of the annular core.

In addition, the toroidal line filter further comprises a base plate for supporting the annular core, wherein the coils are respectively fixed to the base plate in such a way that opposite ends thereof pass through the substrate and project downwardly from the base plate.

According to a winding method of a toroidal line filter for achieving the above-mentioned object of the present invention, a first winding is performed not over the entire area of an annular core but over a predetermined partial area of the annular core and then a second winding is performed over the remaining area of the annular core.

According to an embodiment, the winding method of the toroidal line filter comprises steps of winding a first coil upwardly from the lowermost end to substantially the central part of the annular core; winding a second coil downwardly from the central part to the lowermost end of the annular core; winding a third coil upwardly from the lowermost end to the uppermost end of the annular core; winding a fourth coil downwardly from the uppermost end to the central part of the annular core; and winding a fifth coil upwardly from the central part to the uppermost end of the annular core.

BRIEF DESCRIPTION OF THE DRAWINGS

The above aspects and features of the present invention will be more apparent from the description for certain embodiments of the present invention taken with reference to the accompanying drawings, in which.

It should be understood that throughout the drawings like reference numerals refer to like features, structures and elements.

DETAILED DESCRIPTION OF EXEMPLARY EMBODIMENTS

Hereinbelow, exemplary embodiments of the present invention will be described in more detail with reference to the accompanying drawings.

The matters defined in the description such as a detailed arrangement and elements are provided to assist in a comprehensive understanding of the invention. Thus, it is apparent that various changes and modifications to the embodiments described herein can be made without departing from the scope and spirit of the present invention. Descriptions of well-known functions or constructions are omitted for the sake of clarity and conciseness.

Figure 1A:
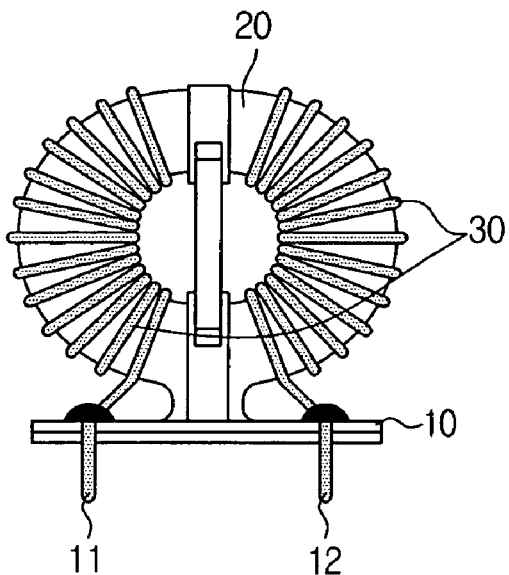
FIGS. 1A and 1B are front and side elevational views of a conventional toroidal line filter, respectively, for illustrating the construction of the conventional toroidal line filter and a winding method of the same.
Figure 1B:
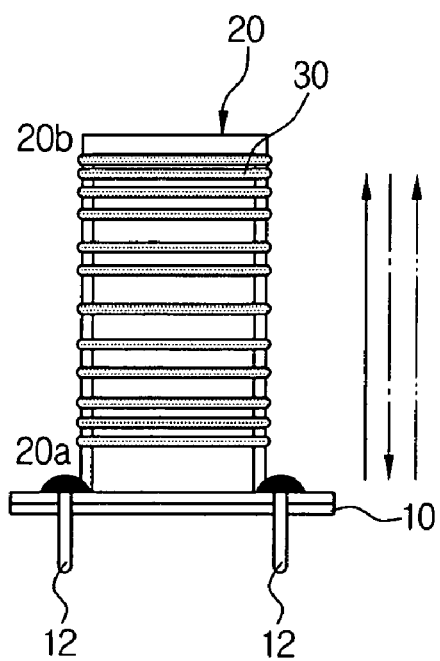
Figure 2A:
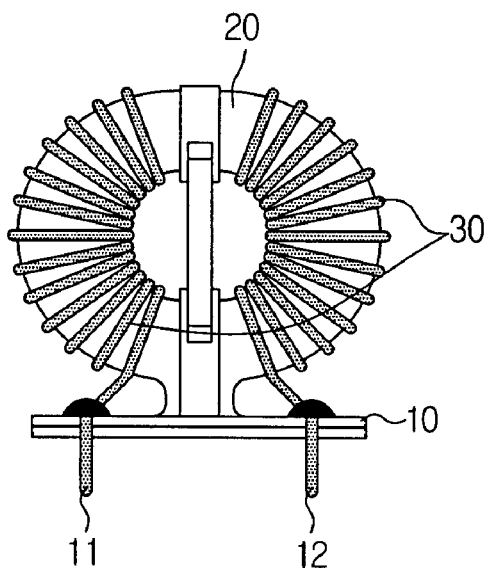
FIGS. 2A and 2B are front and side elevational views of a toroidal line filter according to an embodiment of the present invention, respectively, for illustrating the construction of the inventive toroidal line filter and a winding method of the same.
Figure 2B:
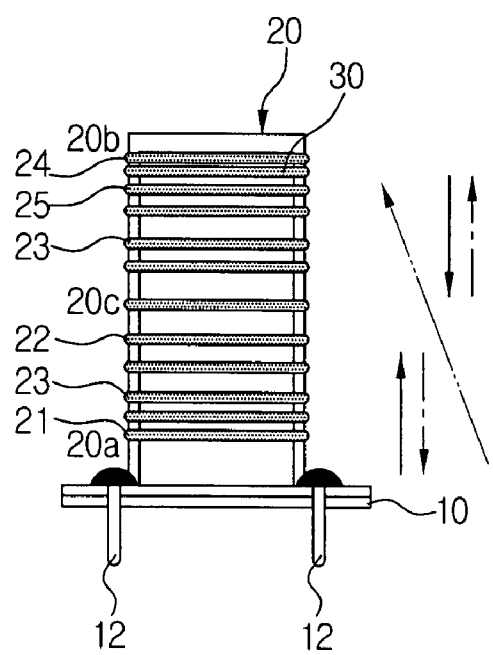

As shown in FIGS. 2A and 2B, the basic construction of a toroidal line filter constructed according to an embodiment of the present invention. The toroidal line filter according to an embodiment of the present invention comprises a base plate 10, an annular core 20 supported on the base plate 10 and coils 30 wound around the annular core 20, which are the same components as those used in the construction of the conventional toroidal line filter described above.

However, the inventive toroidal line filter is different from the conventional one in the winding method of the coils 30. That is, according to the conventional arrangement, the coils 30 are upwardly and downwardly wound over the entire area of the annular core 20, whereby the current flowing direction is fixed over the entire area of the annular core 20 and thus it is difficult to obtain a change in frequency characteristic for a certain frequency band, whereas according to embodiments of the present invention, the coils 30 are wound in such a way that a first coil is wound not over the entire area but over a predetermined partial area of the annular core 20 and then a second coil is wound over the remaining area of the annular core 20.

According to this embodiment, unlike the conventional toroidal line filter with the first coil wound over the entire area of the annular core, the direction of current flow in the annular core is variable, whereby the frequency characteristic of inductance is somewhat differently exhibited. If this characteristic is employed to change a frequency characteristic for a certain frequency range, it is possible to solve the frequency problem without adding an inductor and a capacitor when a poor EMI characteristic is caused at the certain frequency range.

According to this embodiment, the method of winding the toroidal line filter comprises steps of winding a first coil 21 upwardly from the lowermost end 20a to substantially the central part 20c of the annular core 20 (see the lower solid line arrow in FIG. 2B), winding a second coil 22 downwardly from the central part 20c to the lowermost end 20a of the annular core 20 (see the lower one-point-chain line arrow in FIG. 2B), winding a third coil 23 upwardly from the lowermost end 20a to the uppermost end 20b of the annular core 20 (see two-point-chain line arrow in FIG. 2B), winding a preferably biquadratic coil 24 downwardly from the uppermost end 20b to the central part 20c of the annular core 20 (see, the upper solid line arrow in FIG. 2B), and finally winding a fifth coil 25 upwardly from the central part 20c to the uppermost end 20b of the annular core 20 (see the upper one-point-chain line arrow).

Although it has been shown and described that the winding of coils (30) is performed on the upper and lower parts divided with reference to about the central part of the annular core 20 in the present embodiment for the convenience of description, embodiments of the present invention are not limited to this and, a similar result will be obtained, if the first coil is not wound over the entire area of the annular core but wound over a predetermined partial area of the annular core.

The toroidal line filter constructed using embodiments of the present invention is mounted on a substrate (not shown) by means of plural contacts 11 and 12 projected downwardly from the base plate 10 so as to remove a noise frequency produced from each noise source by counterbalancing the noise frequency with an inductance frequency component, like the conventional toroidal line filter.

In order to determine the effects of embodiments of the present invention on toroidal line filters which function as described above, the inductance characteristics of a toroidal line filter with coils wound through the conventional winding method and a toroidal line filter having coils wound through embodiments of the winding method of the present invention were compared with one another through various tests. As a result, the conventional toroidal line filter exhibited an inductance characteristic of 2.64 mH, whereas the toroidal line filter constructed according to embodiments of the present invention exhibited an inductance characteristic of 3.01 mH, which is about 0.5 mH higher than that of the conventional one. In the tests, GP-9 cores and 0.6 Pi windings were used and inductance was measured in 100 kHz.

Figure 3A:
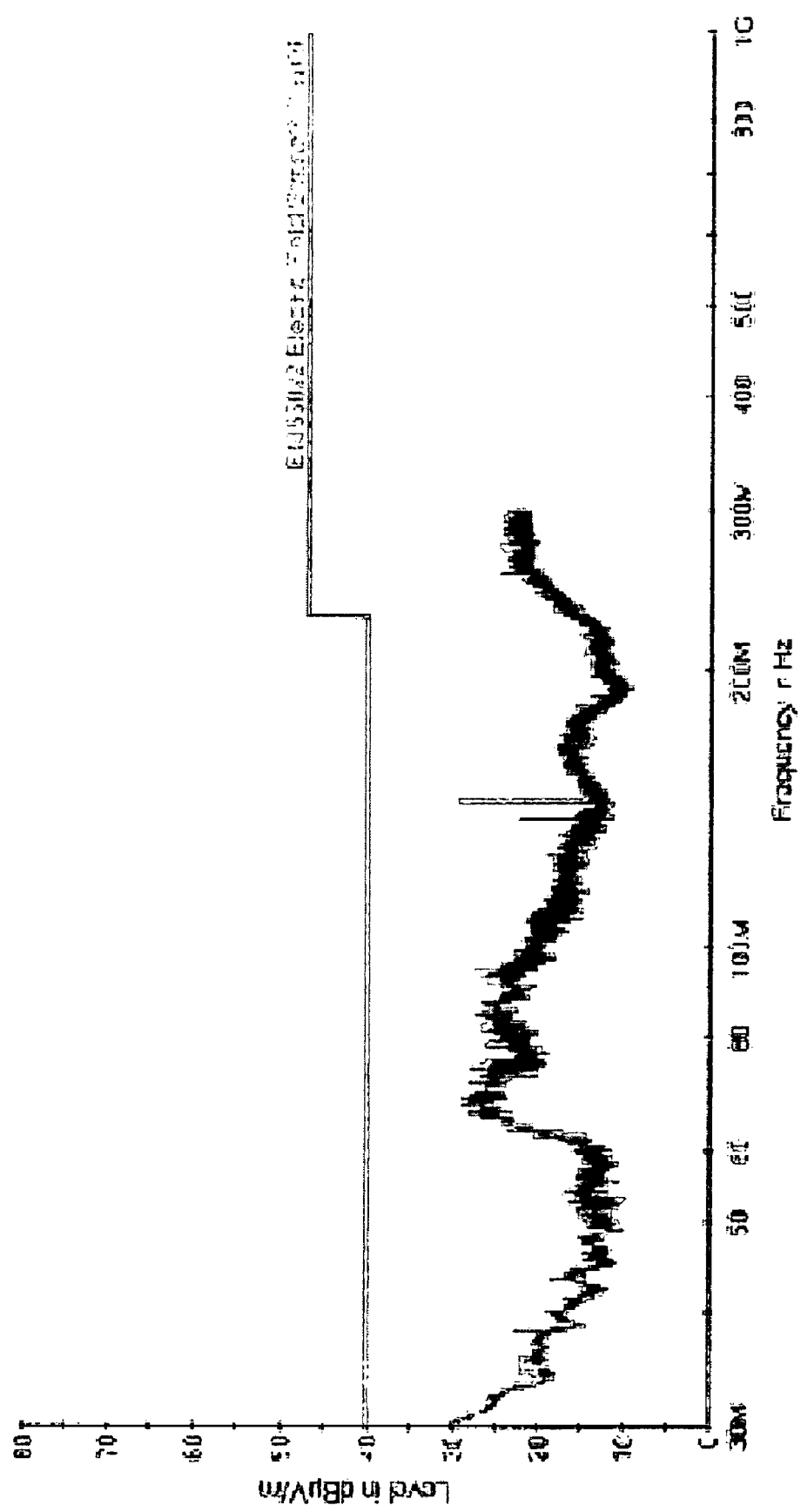
FIGS. 3A and 3B are graphs of the radiation characteristics of the conventional toroidal line filter and the toroidal line filter constructed according to an embodiment of the present invention, respectively.
Figure 3B:
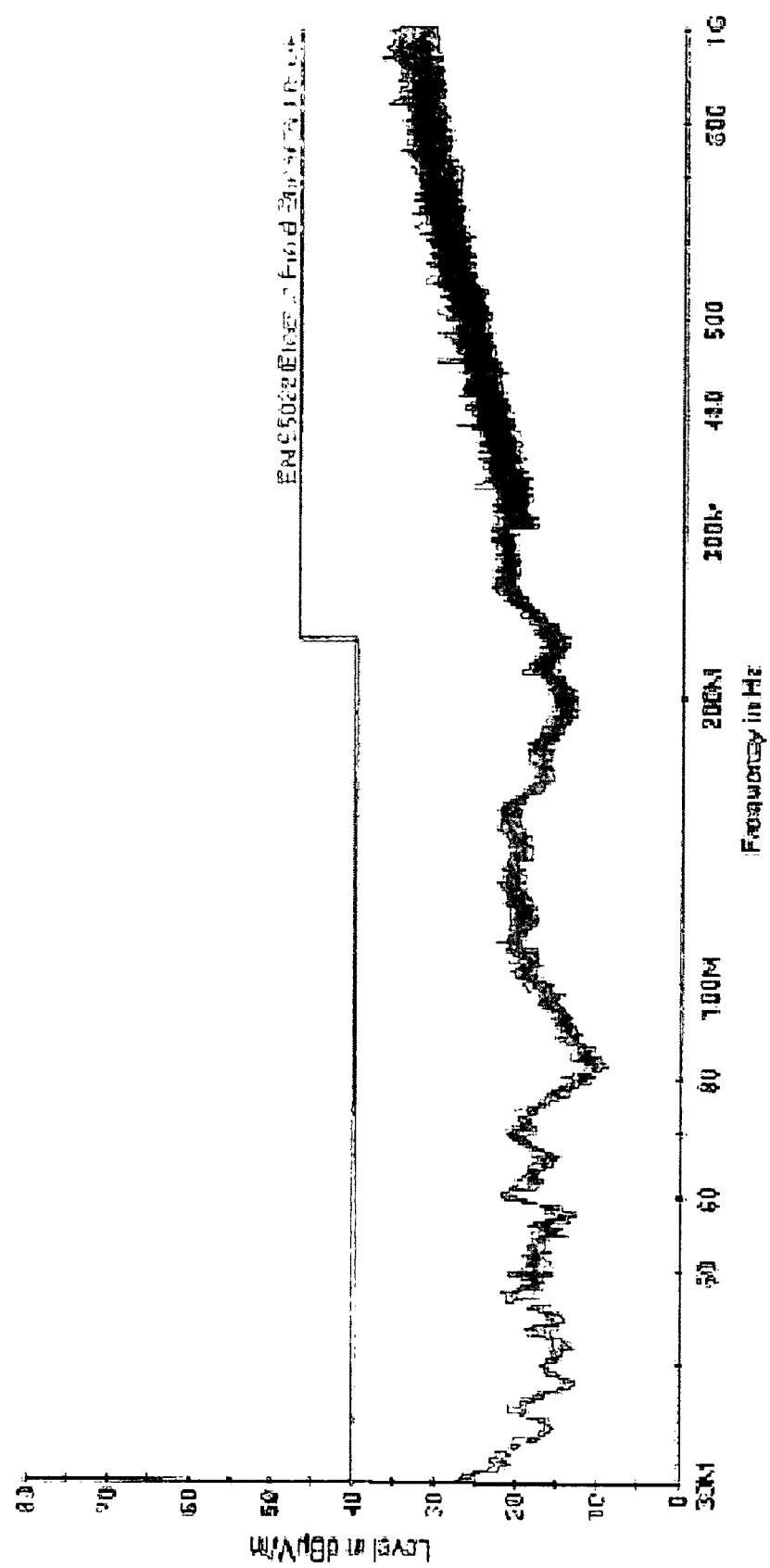

The EMI characteristic improvement effects were also determined through the various tests. As a result, it was found that the conductive noise was improved by the amount of 5 dB in 300 to 400 kHz, and the radiative noise was improved in the amount of 10 dB in 60~80 MHz band. The samples of toroidal line filters were fabricated using GP-9 cores and 1 Pi windings. FIGS. 3A and 3B show the radiative noise test results in comparison between the conventional line filter and the inventive line filter, respectively.

As described above, according to embodiments of the prevent invention, it is possible to implement an SMPS which can satisfy noise and EMI characteristics with a single line filter without adding a component such as an inductor and a capacitor because it is possible to design a line filter having a specific inductance of a desired band. That is, by making it possible to fabricate an inexpensive and small-sized SMPS, embodiments of the present invention can contribute to minimizing the weight and overall size of the electric and electronic products.

While the preferred embodiments of the present invention have been shown and described in order to exemplify the principle of the present invention, the present invention is not limited to the specific embodiments. It will be understood that various modifications and changes can be made by one skilled in the art without departing from the spirit and scope of the invention as defined by the appended claims. Therefore, it shall be considered that such modifications, changes and equivalents thereof are all included within the scope of the present invention.

What is claimed is:

1. A toroidal line filter comprising:

an annular core; and a plurality of coils wound around the annular core, wherein the plurality of coils are configured in such a way that at least one of the plurality of coils is wound over a predetermined partial area of the annular core and at least another one of the plurality of coils is wound over the remaining area of the annular core;

wherein a first coil of the plurality of coils is wound upwardly from the lowermost end to substantially the central part of the annular core, a second coil of the plurality of coils is wound downwardly from the central part to the lowermost end of the annular core, a third coil of the plurality of coils is wound upwardly from the lowermost end to the uppermost end of the annular core, a fourth coil of the plurality of coils is wound downwardly from the uppermost end to the central part of the annular core, and a fifth coil of the plurality of coils is wound upwardly from the central part to the uppermost end of the annular core.

2. A toroidal line filter as claimed in claim 1, further comprising a base plate for supporting the annular core, wherein the plurality of coils are respectively fixed to the base plate in such a way that the opposite ends thereof pass through the substrate and project downwardly from the base plate.

* * * * *